United States Patent
Ikeda

(10) Patent No.: US 9,173,311 B2
(45) Date of Patent: Oct. 27, 2015

(54) POWER SUPPLY APPARATUS FOR SLIDING STRUCTURE

(71) Applicant: Yazaki Corporation, Tokyo (JP)

(72) Inventor: Kei Ikeda, Susono (JP)

(73) Assignee: Yazaki Corporation, Tokyo (JP)

(*) Notice: Subject to any disclaimer, the term of this patent is extended or adjusted under 35 U.S.C. 154(b) by 0 days.

(21) Appl. No.: 14/309,062

(22) Filed: Jun. 19, 2014

(65) Prior Publication Data
US 2014/0299370 A1    Oct. 9, 2014

Related U.S. Application Data

(63) Continuation of application No. PCT/JP2012/082625, filed on Dec. 17, 2012.

(30) Foreign Application Priority Data

Dec. 19, 2011   (JP) ................................ 2011-277107

(51) Int. Cl.
*H05K 5/02* (2006.01)
*H02B 1/44* (2006.01)
*H02B 1/38* (2006.01)
*B60R 16/027* (2006.01)

(52) U.S. Cl.
CPC ............ *H05K 5/0226* (2013.01); *B60R 16/027* (2013.01); *H02B 1/38* (2013.01); *H02B 1/44* (2013.01)

(58) Field of Classification Search
CPC ..... H05K 5/0221; H05K 5/0226; H02B 1/38; H02B 1/44
See application file for complete search history.

(56) References Cited

U.S. PATENT DOCUMENTS

2007/0084619 A1   4/2007   Kisu et al.
2007/0119610 A1   5/2007   Kisu et al.

FOREIGN PATENT DOCUMENTS

| JP | 2003-025850 A | 1/2003 |
| JP | 2005-008010 A | 1/2005 |
| JP | 2005-145258 A | 6/2005 |
| JP | 2007-151257 A | 6/2007 |
| JP | 2007-151377 A | 6/2007 |
| JP | 2008-178208 A | 7/2008 |
| JP | 2010-023757 A | 2/2010 |

OTHER PUBLICATIONS

International Search Report dated Feb. 5, 2013, issued for PCT/JP2012/082625.
Supplementary European Search Report dated Jul. 27, 2015, issued for the European patent application No. 12860005.3.

*Primary Examiner* — Jeremy C Norris
(74) *Attorney, Agent, or Firm* — Locke Lord LLP

(57) ABSTRACT

A power supply apparatus for sliding structure includes a wiring harness having an exterior member wired from a fixed structure-side power supply device to the sliding structure side, the fixed structure-side power supply device including an outer member fixed to the fixed structure, an inner member supported to the outer member so as to rotate in a horizontal direction and configured to support one end portion of the exterior member, and a harness trajectory regulation wall configured to rotate integrally with the inner member. When the sliding structure is fully-opened, the harness trajectory regulation wall projects outward from the outer member in a thickness direction of the sliding structure, such that the exterior member arranged along the harness trajectory regulation wall is moved away from the fixed structure toward the sliding structure side, preventing interference between the exterior member and the fixed structure.

16 Claims, 10 Drawing Sheets

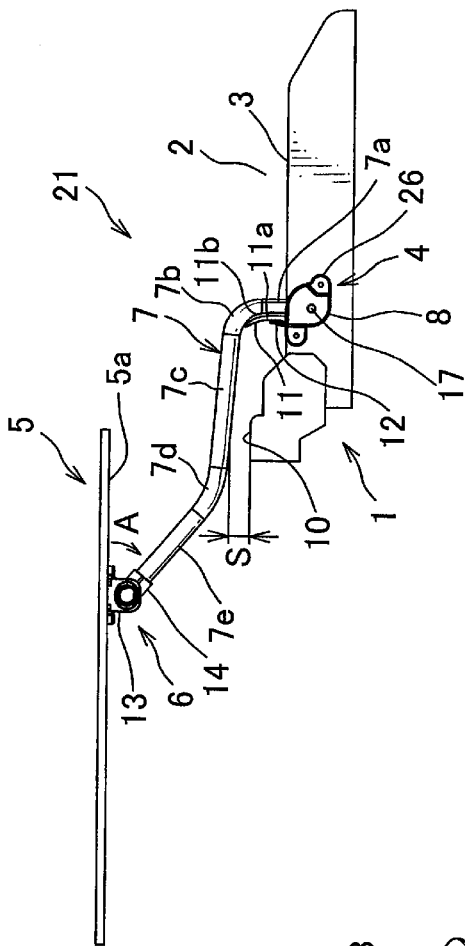
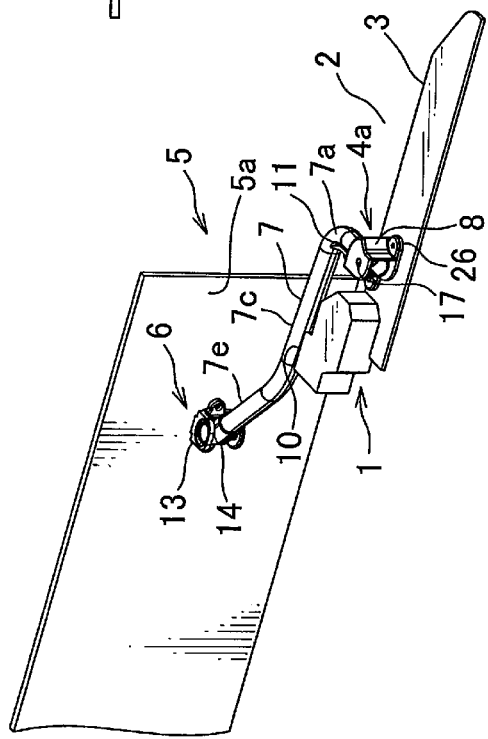

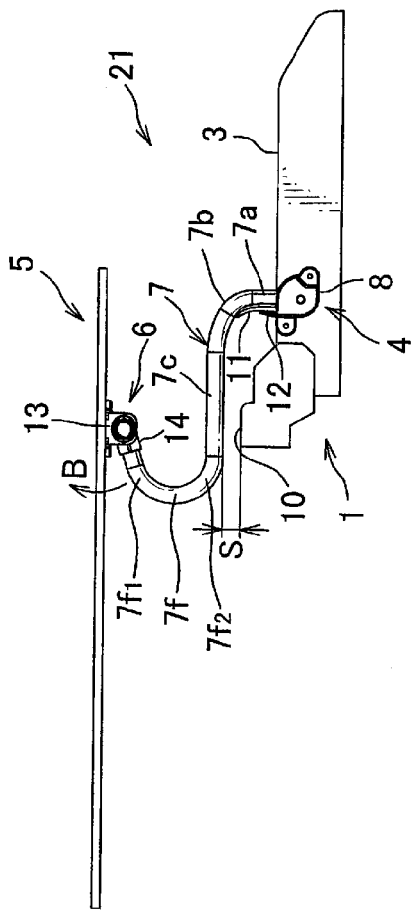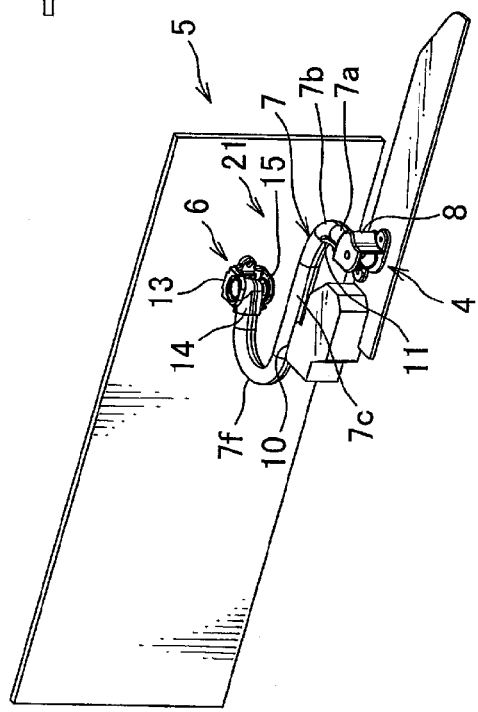

POWER SUPPLY APPARATUS FOR SLIDING STRUCTURE

TECHNICAL FIELD

The present invention relates to a power supply apparatus for sliding structure including a swing member for constantly supplying power from a vehicle body side to a sliding door side of an automobile, for example.

BACKGROUND ART

Various power supply apparatuses for sliding structure have been proposed for constantly supplying power from a power source provided at a vehicle body side to an electrical component or an accessory or the like provided at a sliding door of an automobile, for example.

For example, Patent Literature 1 discloses a power supply apparatus for sliding structure shown in FIGS. 15A and 15B, provided with a case 82 vertically arranged at a sliding door 81 of an automobile, a guide rail arranged parallel within the case, a slider engaged to the guide rail so as to slide in a vehicle front-back direction, and a swing member 83 attached to the slider so as to swing in the vehicle front-back direction. A wiring harness 84 is passed through and fixed to an upper portion of the case 82 and wired substantially in a parallel manner from the slider through the swing member 83 to a harness fixture 86 of a vehicle body 85. The wiring harness 84 includes a plurality of electric wires passed through a corrugate tube (i.e. exterior member) made of synthetic resin.

As shown in FIG. 15A, in a state in which the sliding door 81 is slid to the vehicle front side and fully closed, the wiring harness 84 extends substantially straight from the harness fixture 86 of the vehicle body to the swing member 83 of the sliding door. On the other hand, as shown in FIG. 15B, in a state in which the sliding door 81 is slid to the vehicle back side and fully opened (in fact, the sliding door 81 is moved outward away from the vehicle body 85 when it is slightly opened from the fully-closed state and located along an outer face of the vehicle body 85, and then it is slid further backward), the wiring harness 84 is bent in a substantially U-like or J-like shape in the vehicle front-back direction from the harness fixture 86 at the vehicle body side to the swing member 83 at the sliding door side.

Patent Literature 2 discloses a similar power supply apparatus arranged at the sliding door side as Patent Literature 1, in which an elastic member (not shown) is provided to bias the swing member 83 toward a passenger room side (i.e. in E direction shown in FIG. 15A) when the sliding door 81 is fully closed, so as allow the swing member 83 to swing easily (i.e. so as to allow the wiring harness 84 to bend easily) at the beginning of opening (i.e. during the opening operation) of the sliding door 81.

Furthermore, as the background art the above-mentioned Patent Literature 1 (Patent Literature 3) discloses the wiring harness having a plurality of electric wires passed through a caterpillar-like exterior member made of synthetic resin. This caterpillar-like exterior member includes a plurality of substantially rectangular-tube-shaped pieces bendably connected to each other by engaging a shaft and a hole.

CITATION LIST

Patent Literatures

Patent Literature 1: Japan Patent Application Publication No. 2007-151377 (FIGS. 5-10, 18)

Patent Literature 2: Japan Patent Application Publication No. 2007-151257 (FIG. 4)

Patent Literature 3: Japan Patent Application Publication No. 2003-25850 (FIGS. 2, 4)

SUMMARY OF INVENTION

Technical Problem

However, the conventional power supply apparatus for sliding structure disclosed in Patent Literature 1 has a drawback that, the space and layout for mounting other components to the sliding door side is limited due to the components such as the case 82 and the guide rail provided at the sliding door (i.e. sliding structure) 81 side, and that, the size, weight and cost of the power supplying structure (apparatus) at the sliding door side is increased. Of course, not only the power supplying structure (apparatus) at the sliding door side, but the power supplying structure (apparatus) at the vehicle body side should also not be increased in the size, weight and cost.

Furthermore, when the sliding door 81 is opened (as shown in FIG. 15B), the wiring harness 84 is bent in a substantially U-like shape in the vehicle front-back direction from the harness fixture 86 at the vehicle body (i.e. fixed structure) 85 side to the swing member 83 at the sliding door side so as to prevent the interference between the wiring harness 84 and the vehicle body 85 (that is, if the wiring harness 84 is wired in a substantially straight or near straight fashion from the harness fixture 86 at the vehicle body side to the swing member 83 at the sliding door side, then the wiring harness 84 interferes with a back side 85a of the entrance opening of the vehicle body 85). Thus, there is a drawback that, the wiring harness 84 is bent in the substantially U-like shape every time the sliding door 81 is opened, and this bent condition is maintained as the sliding door 81 is kept opened for a long time, causing the decrease in the bending durability of the wiring harness 84.

Furthermore, there is a drawback that, since the swing member 83 is biased by the elastic member disclosed in Patent Literature 2 only at the beginning of opening (i.e. during the opening operation) of the sliding door 81, the bending of the wiring harness 84 is not smooth at the beginning of closing (i.e. during the closing operation) of the sliding door 81.

There may be the same drawbacks as the ones mentioned above in the case of a constant power supply for other sliding structures such as a sliding door of a vehicle other than an automobile, or a sliding door of a structure other than a vehicle such as a test device and a processing devices. Herein, a vehicle body, a test device body and a processing device body are called a fixed structure, with respect to the sliding structure.

Therefore, an object of the present invention is to provide a power supply apparatus for sliding structure for constantly supplying power from a fixed structure to a sliding structure, which can reduce the size, weight and cost of a sliding structure-side and/or a fixed structure-side power supplying structure, which can reliably prevent, with a simple structure, the interference between a wiring harness and the fixed structure when the sliding structure is fully-opened or half-opened, which can prevent the decrease in the bending durability of the wiring harness due to the prevention of said interference, and which can achieve smooth bending of the wiring harness during the opening operation and/or the closing operation of the sliding structure to improve the bending durability of the wiring harness.

Solution to Problem

To achieve the above-described object, a first aspect of the present invention provides a power supply apparatus for sliding structure including: a fixed structure-side power supply device; and a wiring harness having an exterior member and wired from the fixed structure-side power supply device to a sliding structure side, wherein the fixed structure-side power supply device includes: an outer member fixed to the fixed structure; an inner member supported to the outer member so as to rotate in a horizontal direction and configured to support one end portion of the exterior member; and a harness trajectory regulation wall configured to rotate integrally with the inner member, wherein, when the sliding structure is fully-opened, the harness trajectory regulation wall projects outward from the outer member in a thickness direction of the sliding structure, such that the exterior member arranged along the harness trajectory regulation wall is moved away from the fixed structure toward the sliding structure side, thereby preventing interference between the exterior member and the fixed structure.

According to the above-described structure, the fixed structure-side power supply device is composed of three parts, namely, the outer member, the inner member and the harness trajectory regulation wall, thereby providing the simplified, downsized, weight-reduced and cost-reduced fixed structure-side power supply device. As the sliding structure is opened and closed, the inner member is pulled by the exterior member of the wiring harness and is rotated with the harness trajectory regulation wall in the opening/closing direction of the sliding structure. When the sliding structure is fully opened, the harness trajectory regulation wall is rotated with the inner member in the opening direction of the sliding structure and projects from the fixed structure side toward the sliding structure side in the sliding door thickness direction, and the exterior member of the wiring harness projects outward from the fixed structure along the harness trajectory regulation wall and wired to the sliding structure in the opening direction of the sliding structure.

Making the exterior member of the wiring harness project outward from the fixed structure along the harness trajectory regulation wall will create a sufficient space between the fixed structure and the exterior member portion of the wiring harness wired to the sliding structure in the opening direction of the sliding structure. Thus, the interference between the exterior member portion and the fixed structure can be prevented. The exterior member of the wiring harness extending toward the sliding structure along the harness trajectory regulation wall is wired by being bent in the substantially L-like shape, thus the bending durability of the wiring harness is improved compared to the conventional art in which the wiring harness is bent in the substantially U-like shape.

The fixed structure is suitable as a vehicle body of an automobile, and the sliding structure is suitable as a sliding door. For the exterior member of the wiring harness, a corrugate tube (protective tube) made of synthetic resin or other protective tubes, or a caterpillar-like exterior member formed by connecting a plurality of pieces made of synthetic resin, or the like can be suitably used. The fixed structure side with respect to the sliding structure is defined as inside (i.e. inward), and the sliding structure side with respect to the fixed structure is defined as be outside (i.e. outward).

A second aspect of the present invention provides the power supply apparatus for sliding structure according to the first aspect, wherein, when the sliding structure is fully-closed, the harness trajectory regulation wall is rotated and escaped with the inner member in a closing direction of the sliding structure, thereby preventing the interference between the harness trajectory regulation wall and the sliding structure.

According to the above-described structure, the inner member is pulled by the wiring harness in the closing direction of the sliding structure, and the harness trajectory regulation wall is rotated and slanted integrally with the inner member in the closing direction of the sliding structure. As a result, the outward projection length (i.e. projection length in the sliding structure thickness direction) of the harness trajectory regulation wall is reduced, thereby preventing the interference between the sliding structure and the harness trajectory regulation wall.

A third aspect of the present invention provides the power supply apparatus for sliding structure according to the second aspect, wherein the fixed structure-side power supply device includes a spring member configured to bias the inner member so as to rotate the harness trajectory regulation wall in the closing direction of the sliding structure.

According to the above-described structure, the harness trajectory regulation wall is biased and actively slanted integrally with the inner member by the biasing force of the spring member in the closing direction of the sliding structure. As a result, the outward projection length (i.e. projection length in the sliding structure thickness direction) of the harness trajectory regulation wall is reliably reduced, thereby preventing the interference between the sliding structure and the harness trajectory regulation wall.

A forth aspect of the present invention provides the power supply apparatus for sliding structure according to any one of the first to third aspects, wherein a sliding structure-side power supply device provided to the sliding structure includes: an outer member fixed to the sliding structure; an inner member supported to the outer member so as to rotate in a horizontal direction and configured to support another end portion of the exterior member; and a spring member configured to bias the inner member so that the inner member is rotated inward from the sliding structure when the sliding structure is fully-opened.

According to the above-described structure, the sliding structure-side power supply device is composed of the three parts, namely, the outer member, the inner member and the spring member, thereby providing the simplified, downsized, weight-reduced and cost-reduced sliding structure-side power supply device. When the sliding structure is fully opened, the spring member biases and rotates (i.e. slants) the inner member inward, and makes the exterior member continuing to the inner member to move inward and away from the sliding structure in a slanted fashion when seen from top, so as to lead the exterior member to smoothly bend in the next closing operation (at the beginning). Furthermore, when the sliding structure is half-opened, the inner member is rotated to almost opposite side (i.e. almost reversed position) with respect to the fully-opened state of the sliding structure by the biasing force of the spring member and moved close to the sliding structure. As a result, the exterior member is moved outward away from the fixed structure while being bent in the substantially U-like shape, thereby preventing the interference between the exterior member and the fixed structure.

A fifth aspect of the present invention provides the power supply apparatus for sliding structure, wherein spring force of the spring member of the fixed structure-side power supply device according to the third aspect is set to be equal to or stronger than spring force of the spring member of the sliding structure-side power supply device according to the fourth aspect.

According to the above-described structure, when the sliding structure is half-opened, the spring force of the spring member of the fixed structure-side power supply device overcomes the spring force of the spring member of the sliding structure-side power supply device, and makes the inner member of the fixed structure-side power supply device to rotate with the exterior member of the wiring harness in the closing direction of the sliding structure. Thus, the exterior member is bent in the substantially U-like shape in the closing direction of the sliding structure and wired without a slack from the inner member of the fixed structure-side power supply device to the inner member of the sliding structure-side power supply device, thereby securing a large space between the exterior member and the fixed structure-side portion which is likely to interfere, reliably preventing the interference between the exterior member and the fixed structure-side portion.

A sixth aspect of the present invention provides the power supply apparatus for sliding structure according to the fourth or fifth aspect wherein the outer member of the sliding structure-side power supply device includes a stopper projection configured to make the inner member of the sliding structure-side power supply device to abut on the stopper projection at an inwardly-rotated position with respect to the sliding structure.

According to the above-described structure, when the sliding structure is fully opened, the inner member of the sliding structure-side power supply device abuts on the stopper projection of the outer member and the inner member is stopped at the position where the inner member is rotated (i.e. slanted) inward from the sliding structure with the exterior member of the wiring harness (in fact, said position is an imaginary position since the inner member does not actually rotate). Thus, the exterior member continuing to the inner member is moved inward away from the sliding structure in a slanted fashion when seen from top, so as to lead the exterior member to smoothly bend in the next closing operation (at the beginning). Also, due to the combination of the stopper projection and the spring member of the sliding structure-side power supply device, the spring member can reliably exert its action.

A seventh aspect of the present invention provides a power supply apparatus for sliding structure including: a fixed structure-side power supply device; a sliding structure-side power supply device; and a wiring harness having an exterior member and wired from the fixed structure-side power supply device to the sliding structure-side power supply device, wherein the fixed structure-side power supply device includes: an outer member fixed to the fixed structure; an inner member supported to the outer member so as to rotate in a horizontal direction and configured to support one end portion of the exterior member; and a first spring member configured to bias the inner member so as to rotate in a closing direction of the sliding structure, wherein the sliding structure-side power supply device includes: an outer member fixed to the sliding structure; an inner member supported to the outer member so as to rotate in the horizontal direction and configured to support another end portion of the exterior member; and a second spring member configured to bias the inner member so as to rotate in an opening direction of the sliding structure, and wherein spring force of the first spring member is set to be equal to or stronger than spring force of the second spring member.

According to the above-described structure, when the sliding structure is half-opened, the spring force of the first spring member of the fixed structure-side power supply device overcomes the spring force of the second spring member of the sliding structure-side power supply device, and makes the inner member of the fixed structure-side power supply device to rotate with the exterior member of the wiring harness in the closing direction of the sliding structure. Thus, the exterior member is bent in the substantially U-like shape in the closing direction of the sliding structure and wired without a slack from the inner member of the fixed structure-side power supply device to the inner member of the sliding structure-side power supply device, thereby securing a large space between the exterior member and the fixed structure-side portion which is likely to interfere, thereby reliably preventing the interference between the exterior member and the fixed structure-side portion. Furthermore, when the sliding structure is fully opened, the second spring member of the sliding structure-side power supply device inwardly biases and rotates (i.e. slants) the inner member, and the exterior member continuing to the inner member is moved inward away from the sliding structure in a slanted fashion when seen from top, so as to lead the exterior member to smoothly bend in the next closing operation (at the beginning).

Advantageous Effects of Invention

According to the first aspect of the present invention, the fixed structure-side power supply device is composed of the three parts, namely, the outer member, the inner member and the harness trajectory regulation wall, thereby providing the simplified, downsized, weight-reduced and cost-reduced fixed structure-side power supply device. Furthermore, when the sliding structure is opened, the harness trajectory regulation wall can move the wiring harness away in the outward direction, preventing the interference between the wiring harness and the fixed structure and improving the reliability of constant power supply to the sliding structure. Furthermore, when the sliding structure is opened, the wiring harness extending toward the sliding structure along the harness trajectory regulation wall is bent in the substantially L-like shape. Thus, the bending durability of the wiring harness, i.e. the exterior member and the plurality of electric wires passed through the exterior member, can be improved compared to the conventional wiring harness which is bent in the substantially U-like shape.

According to the second aspect of the present invention, the interference between the harness trajectory regulation wall and the sliding structure during closing (i.e. in middle of closing and in fully-closed state) of the sliding structure as well as damage and such of the harness trajectory regulation wall caused therefrom can be prevented.

According to the third aspect of the present invention, by actively making the harness trajectory regulation wall to slant integrally with the inner member by the biasing force of the spring member, the interference between the harness trajectory regulation wall and the sliding structure during closing (i.e. in middle of closing and in fully-closed state) of the sliding structure as well as damage and such of the harness trajectory regulation wall caused therefrom can be prevented reliably.

According to the fourth aspect of the present invention, by moving the inner member of the sliding structure-side power supply device inward away from the sliding structure by the biasing force of the spring member when fully opening the sliding structure, the exterior member of the wiring harness can be smoothly bent in the next closing operation and half-opening operation of the sliding structure, improving the bending durability of the wiring harness. Furthermore, when the sliding structure is half-opened, the inner member of the sliding structure-side power supply device is moved close to the sliding structure by the biasing force of the spring member in the substantially reversed position with respect to the position of the fully-opened state of the sliding structure, and the exterior member of the wiring harness is moved away from the fixed structure. Thus, the interference between the exterior member and the fixed structure can be prevented, improving the reliability of the constant power supply.

According to the fifth aspect of the present invention, when the sliding door is half-opened, the strong spring force of the spring member of the fixed structure-side power supply device overcomes the spring force of the spring member of the sliding structure-side power supply device, and the exterior member of the wiring harness is bent in the closing direction of the sliding structure and wired without a slack. Thus, the interference between the exterior member and the fixed structure can be prevented reliably and the bending durability of the wiring harness can be improved.

According to the sixth aspect of the present invention, the rotational angle of the inner member can be regulated by the stopper projection of the sliding structure-side power supply device, thereby facilitating the smooth bending of the wiring harness when closing the sliding structure from the fully-opened state and preventing the loose in strength of the spring member of the sliding structure-side power supply device and facilitating the function of the spring member.

According to the seventh aspect of the present invention, when the sliding structure is half-opened, the strong spring force of the first spring member of the fixed structure-side power supply device overcomes the spring force of the second spring member of the sliding structure-side power supply device, and thus the exterior member is bent in the closing direction of the sliding structure and wired without a slack to the sliding structure-side power supply device, thereby reliably preventing the interference between the exterior member and the fixed structure and improving the bending durability of the wiring harness. Furthermore, when the sliding structure is fully opened, the inner member of the sliding structure-side power supply device is moved inward away from the sliding structure by the biasing force of the second spring member, allowing the exterior member of the wiring harness to smoothly bend in the next closing operation and half-opening operation of the sliding structure, improving the bending durability of the wiring harness.

BRIEF DESCRIPTION OF DRAWINGS

FIG. 1A shows one embodiment of a power supply apparatus for sliding structure according to the present invention and shows a perspective view of a sliding door in a fully-opened state;

FIG. 1B shows a top view of FIG. 1A;

FIG. 2A shows the power supply apparatus for sliding structure and shows a perspective view of the sliding door in a half-opened state;

FIG. 2B shows a top view of FIG. 2A;

DESCRIPTION OF EMBODIMENTS

Figure 3B:
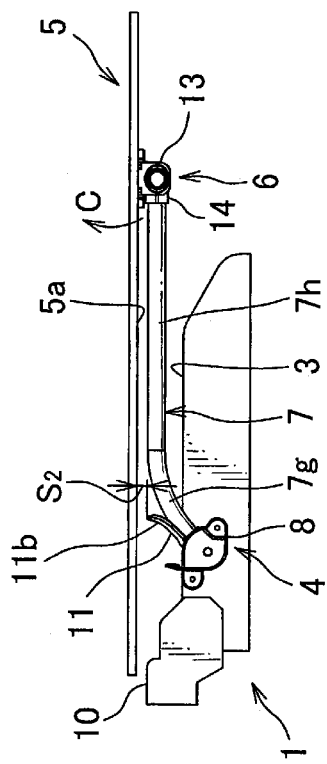
FIG. 3B shows a top view of FIG. 3A.
Figure 3A:
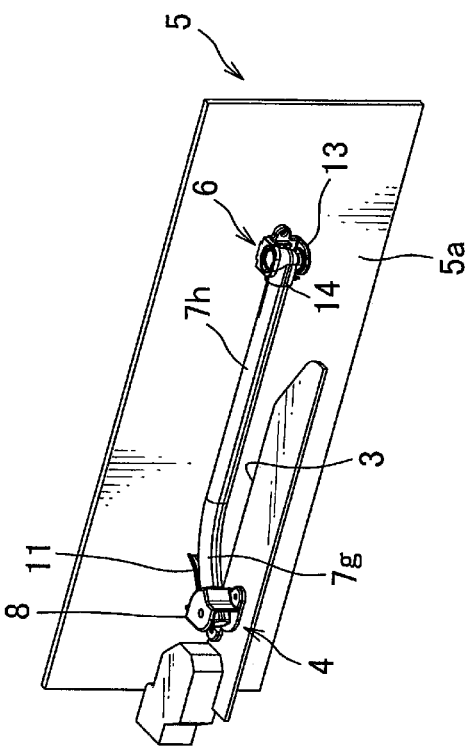
FIG. 3A shows the power supply apparatus for sliding structure and shows a perspective view of the sliding door in a fully-closed state.

FIGS. 1-3 show one embodiment of a power supply apparatus for sliding structure according to the present invention. FIGS. 1A and 1B show a sliding door (i.e. sliding structure) located at a vehicle left side of an automobile in a fully-opened state, FIGS. 2A and 2B show the sliding door in a half-opened state, and FIGS. 3A and 3B show the sliding door in a fully-closed state.

As shown in FIGS. 1A and 1B, a power supply apparatus for sliding structure 21 includes a vehicle body-side power supply device 4 disposed for example at a vehicle back side of a step 3 of an entrance opening 2 of a vehicle body 1 of the automobile, a sliding door-side power supply device 6 disposed to an inner panel 5a made of metal of a sliding door 5 and arranged at the same height as the vehicle body-side power supply device 4, and a wiring harness (indicated by a reference sign 7) having a corrugate tube (i.e. an exterior member or a protective tube) 7 horizontally wired between the both power supply devices 4, 6.

The vehicle body-side power supply device 4 includes an outer member 8 made of synthetic resin and fixed to the vehicle body side, and an inner member 9 (refer to FIG. 4A) pivotally-supported to the outer member 8 so as to rotate (i.e. swing) in a horizontal direction and configured to retain (i.e. support) one end portion of the corrugate tube 7 of the wiring harness. The inner member 9 includes, at its back side, a harness trajectory regulation wall 11 for bending and guiding the corrugate tube 7 of the wiring harness in a backward direction (i.e. in an opening direction of the sliding door), while making the corrugate tube 7 to project toward a vehicle outside in a sliding door thickness direction from a vehicle body portion 10 (see FIG. 1) located at the back side of the step, such that the corrugate tube 7 does not interfere with the vehicle body portion 10. The outer member 8 includes, at its back side, a stopper wall portion 12 for abutting and stopping the harness trajectory regulation wall 11.

The harness trajectory regulation wall 11 is rotatable in the horizontal direction with the inner member 9 (see FIGS. 4A-4C), and has a curved portion 11b located at a distal end of a straight portion 11a and curved in the vehicle back direction. When the sliding door 5 is fully opened, the straight portion 11a is arranged perpendicular to the vehicle front-back direction and located in the thickness direction of the sliding door 5 pointing to the left, and the curved portion 11b is positioned diagonally-backward with respect to the straight portion 11a. A distal end of the curved portion 11b is located so as to project a little toward the vehicle outside with respect to the vehicle body portion 10 which is likely to interfere with the corrugate tube 7 of the wiring harness.

The corrugate tube 7 of the wiring harness is located along an inner face (i.e. a front face) of the straight portion 11a of the harness trajectory regulation wall 11 and arranged straight for a short distance (a short straight portion is indicated by a reference sign 7a) and perpendicular to the vehicle front-back direction with pointing to the left, and at the same time, the corrugate tube 7 is curved smoothly with a relatively large radius of curvature to the backward direction along an inner face of the curved portion 11b of the harness trajectory regulation wall 11. Furthermore, the corrugate tube 7 is wired, from the curved portion 7b, straight in the backward direction and in a slanted manner in a diagonally-outward direction (a front-half slanted straight portion is indicated by a reference sign 7c) with a sufficient space S from an outer face of the vehicle body portion 10 which is likely to interfere. Furthermore, at the longitudinal middle portion of the corrugate tube 7 and at a location of backwardly passing over the vehicle body portion 10, the corrugate tube 7 is bent toward the vehicle outside in a wide V-like shape when seen from a top (a middle bent portion is indicated by a reference sign 7d), and the corrugate tube 7 is further wired to the sliding door-side power supply device 6 straight and in a slanted manner when seen from a top (a back-half slanted straight portion is indicated by a reference sign 7e).

The sliding door-side power supply device 6 includes an outer member 13 fixed to the inner panel 5a of the sliding door 5, an inner member 14 pivotally-supported to the outer member 13 so as to rotate (swing) in the horizontal direction and configured to retain (support) the other end portion of the corrugate tube 7 of the wiring harness, and a later-described spring member (see FIGS. 7A, 7B) configured to bias the inner member 14 toward the passenger room side (i.e. the vehicle body side).

When the sliding door 5 is in the fully-opened state as shown in FIGS. 1A and 1B, the corrugate tube 7 of the wiring harness is biased (i.e. forced) with inner member 14 toward the passenger room side (i.e. the vehicle body 1 side) so as to move away from the sliding door 5 by the biasing force of the spring member 15, as indicated by the arrow A, so that the back-half portion of the corrugate tube 7 of the wiring harness is slanted at a substantially sharp angle with respect to the door inner panel 5a and forming the back-half slanted straight portion 7e.

Thus, when transferring from the fully-opened state of the sliding door 5 of FIGS. 1A and 1B to the half-opened state of the sliding door 5 of FIGS. 2A, 2B, the back-half portion of the corrugate tube 7 of the wiring harness can be bent smoothly in the substantially U-like shape without inducing a buckling and such (a substantially U-like bent portion is indicated by a reference sign 7f), thereby improving the bending durability of the wiring harness (i.e. the corrugate tube 7 and the plurality of insulation covered electric wires passed through the corrugate tube 7) in the half-opened state of the sliding door 5, and allowing the smooth extension action toward the frontward direction (i.e. the sliding door closing direction) of the corrugate tube 7 of the wiring harness in the fully-closed state of the sliding door 5 of FIGS. 3A and 3B.

Referring to FIGS. 2A and 2B, as the sliding door 5 is closed forwardly from the fully-opened state of FIGS. 1A and 1B, the back-half portion of the corrugate tube 7 of the wiring harness is bent in the substantially U-like shape (the substantially U-like bent portion is indicated by the reference sign 7f), and a portion $7f_1$ of the corrugate tube 7 located at the back-half portion (bent portion) 7f near the sliding door 5 is biased closer to the sliding door 5 by the spring member 15 of the sliding door-side power supply device 6, as indicated by the arrow B. Thus, the radius of curvature of the substantially U-like bent portion 7f of the corrugate tube 7 is defined to be large, thereby improving the bending durability of the wiring harness (i.e. the wiring harness including at least the corrugate tube 7 an the plurality of electric wires). If other wire body other than the electric wire, such as a tube, is passed through the corrugate tube, then the bending durability of this wire body can also be improved.

At the same time, by the biasing force of the spring member 15 in the B direction, the portion $7f_1$ of the back-half portion 7f of the corrugate tube 7 located near the sliding door and the portion $7f_2$ of the back-half portion 7f located distant from the sliding door are biased to the B direction, i.e. the outward direction away from the vehicle body portion 10 which is likely to interfere, thereby defining the large space S between the vehicle body portion 10 and the straight portion 7c continuing to the portion $7f_2$ of the corrugate tube 7 located distant from the sliding door. Thus, the interference between the corrugate tube 7 and the vehicle body portion 10 is prevented reliably.

The straight portion 7c of the corrugate tube 7 is arranged substantially parallel to the step 4 of the vehicle body 1, and there is sufficient space S between the straight portion 7c and the vehicle body portion 10 which is likely to interfere. Also, the front portions 7a, 7b continuing to the straight portion 7c are wired along the harness trajectory regulation wall 11 of the vehicle body-side power supply device 4 while being curved in the similar fashion as shown in FIGS. 1A and 1B, and are wired to the inner member 9 (see FIG. 4A) of the vehicle body-side power supply device 4.

In the half-opened state of the sliding door 5 shown in FIGS. 2A and 2B, the harness trajectory regulation wall 11 of the vehicle body-side power supply device 4 is arranged perpendicular to the step 3 of the vehicle body 1, i.e. to the vehicle front-back direction, and is projecting toward the vehicle outside in the similar fashion as shown in FIGS. 1A and 1B. Also, the harness trajectory regulation wall 11 abuts on the stopper wall portion 12 located at the back end side of the outer member 8, thus further backward counterclockwise rotation (i.e. swing) of the harness trajectory regulation wall 11 is prevented.

Figure 15A:
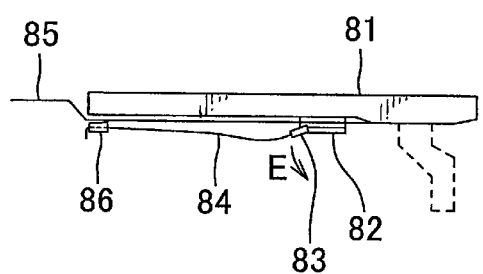
FIGS. 15A and 15B are top views showing the action of a conventional power supply apparatus for sliding structure.
Figure 15B:
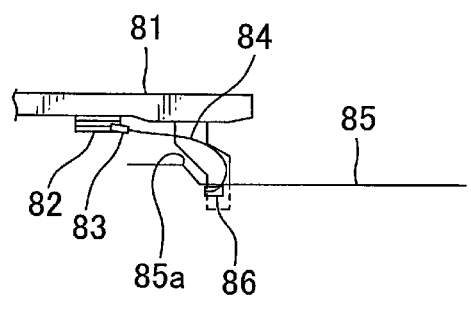

The half-opened state of the sliding door 5 of FIGS. 2A and 2B takes place just for a moment, and thus the substantially U-like bending (indicated by 7f) of the back-half portion of the corrugate tube 7 of the wiring harness is immediately dissolved. Thus, the bending durability of the wiring harness (i.e. the corrugate tube 7 and the plurality of electric wires) is not much reduced (that is, compared to the substantially J-like bending of the wiring harness during the fully-opened state of the sliding door of the conventional example shown in FIGS. 15A and 15B, the bending takes place for a very short time, so the reduction rate of the bending durability is small).

From the half-opened state of the sliding door 5 of FIGS. 2A and 2B, the sliding door 5 is further slid forward and moved closer to the vehicle body (i.e. the passenger room side) 1 along the guide rail not shown of the vehicle body side, and the fully-closed state of the sliding door 5 is reached, as shown in FIGS. 3A and 3B.

From the half-opened state of the sliding door 5 of FIGS. 2A and 2B, the inner member 9 of the vehicle body-side power supply device 4 rotates forward and clockwisely with the harness trajectory regulation wall 11. In the fully-closed state of the sliding door 5 of FIGS. 3A and 3B, the harness trajectory regulation wall 11 is positioned in a diagonally-forward and outward manner, so the distal end of the curved portion 11b of the harness trajectory regulation wall 11 is positioned in a non-contact fashion with a space $S_2$ from the inner panel 5a of the sliding door 5.

That is, the forward rotation of the harness trajectory regulation wall 11 reduces the projecting length of the harness trajectory regulation wall 11 in the vehicle outward direction which is the direction perpendicular to the step (i.e. the direction perpendicular to the vehicle front-back direction), thereby preventing the interference between the harness trajectory regulation wall 11 and the inner panel 5a of the sliding door 5. A lower end of a door trim made of synthetic resin, not shown, located outside of the inner panel 5a of the sliding door 5 is positioned above the harness trajectory regulation wall 11, thus it does not cause any interference.

From the half-opened state of the sliding door 5 of FIGS. 2A and 2B, the harness trajectory regulation wall 11 is rotated with the inner member 9 as shown in FIGS. 3A and 3B, because the one end portion of the corrugate tube 7 of the wiring harness is retained and fixed to the inner member 9. That is, the corrugate tube 7 and the inner member 9 rotate (i.e. swing) together. This is the same for the transition from the fully-closed state of the sliding door 5 shown in FIGS. 3A and 3B to the half-opened state of the sliding door 5 shown in FIGS. 2A and 2B.

In the fully-closed state of the sliding door 5 shown in FIGS. 3A and 3B, the corrugate tube 7 of the wiring harness is bent forward in a curved manner (a curved portion is indicated by a reference sign 7g) along the inner face (i.e. the front face) of the harness trajectory regulation wall 11 of the vehicle body-side power supply device 4 and is extended forward in a straight manner (a straight portion is indicated by a reference sign 7h) to the sliding door-side power supply device 6. The biasing force of the spring member 15 (see FIGS. 2A-2B) of the sliding door-side power supply device 6 biases the straight portion 7h of the corrugate tube 7 in the direction closer to the inner panel 5a of the sliding door 5 as indicated by an arrow C, thereby preventing the interference between the corrugate tube 7 and the step 3 or its neighborhood portion of the vehicle body 1.

The action of the power supply apparatus 21 from the fully-closed state of the sliding door 5 shown in FIGS. 3A and 3B to the half-opened state of the sliding door 5 shown in FIGS. 2A and 2B, or the action of the power supply apparatus 21 from the half-opened state of the sliding door 5 shown in FIGS. 2A and 2B to the fully-opened state of the sliding door 5 shown in FIGS. 1A and 1B, is a mere reverse action of the action from the half-opened state to the fully-closed state of the sliding door 5, or the action from the fully-opened state to the half-opened state of the sliding door 5 as described above, thus the explanation thereof is eliminated.

FIGS. 4A, 4B, 4C through FIGS. 6A, 6B, 6C illustrate one embodiment of the vehicle body-side power supply device.

Figure 4A:
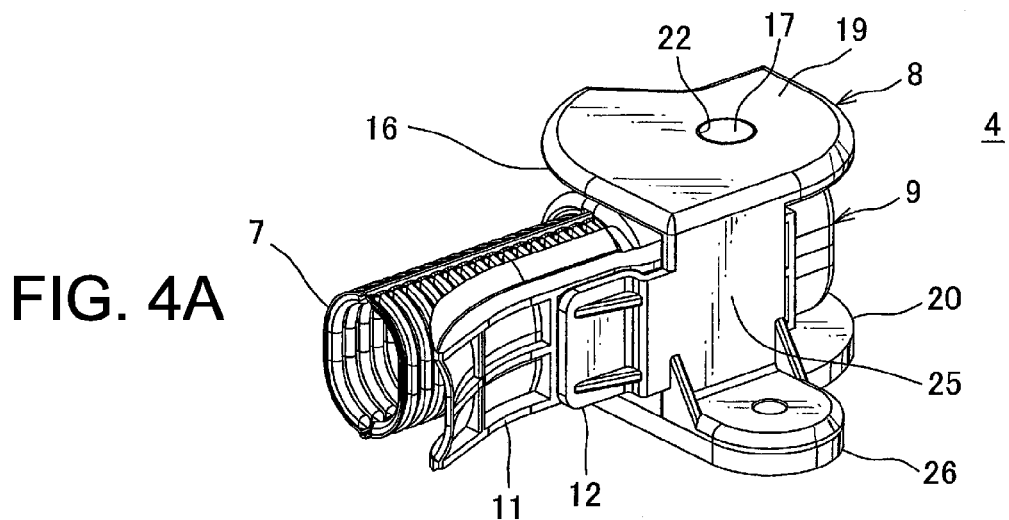
FIG. 4A through 4C show the one embodiment of a vehicle body-side power supply device viewed at different angles and for different actions.
Figure 4B:
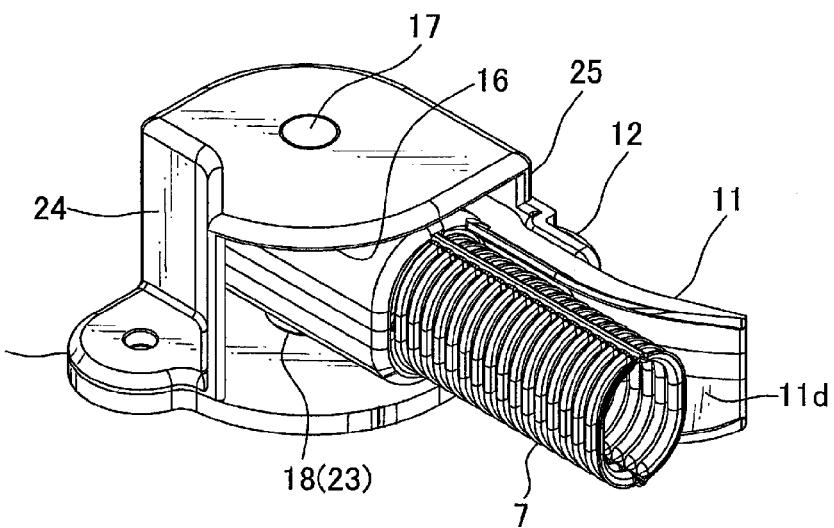
Figure 4C:
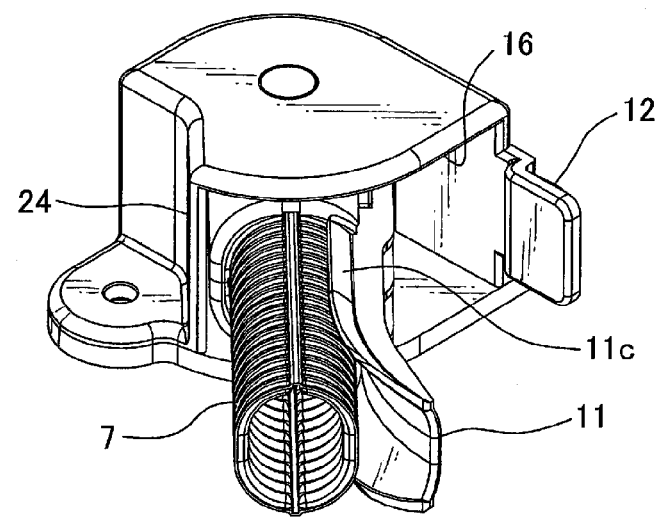

As shown in FIGS. 4A, 4B and 4C, the case-like outer member 8 of the vehicle body-side power supply device 4 which is made of synthetic resin includes an opening 16 which spreads in a fan-like shape in the horizontal direction. The harness trajectory regulation wall 11 made of synthetic resin projects from the opening 16 along the corrugate tube 7 made of synthetic resin, and the inner member 9 made of synthetic resin rotates (i.e. swings) with the harness trajectory regulation wall 11 and the corrugate tube 7 along the fan-like opening 16.

The inner member 9 is rotatably supported to circular hole portions 22, 23 of upper and lower horizontal wall portions 19, 20 of the outer member 8 by upper and lower short cylindrical shaft portions 17, 18, so that the inner member 9 is rotatably housed in the space surrounded by the upper and lower horizontal wall portions 19, 20 and front and back vertical wall portions 24, 25 of the outer member 8. The front wall portion 24 is bent in a wide substantially V-like shape when seen from top, so that the opening 16 side of the front wall portion 24 is broad. The fan-like opening 16 is formed between one ends (i.e. left ends) of the upper, lower, right and left wall portions 19, 20, 24, 25. The plate-like stopper wall portion 12 for abutting on the harness trajectory regulation wall 11 is arranged to project from an opening end of the back-side straight wall portion 25. A horizontal flange-like bracket 26 for the fixation to the vehicle body side is provided in an overlapping fashion to the lower end of the front and back wall portions 24, 25 and the lower wall portion 20 of the outer member 8.

FIGS. 4A and 4B show the state in which the inner member 9 is rotated in the vehicle back direction with the harness trajectory regulation wall 11 (this state corresponds to FIGS. 1A-2B), and FIG. 4C shows the state in which the inner member 9 is rotated in the vehicle front direction with the harness trajectory regulation wall 11 (this state corresponds to FIGS. 3A, 3B).

Figure 5:
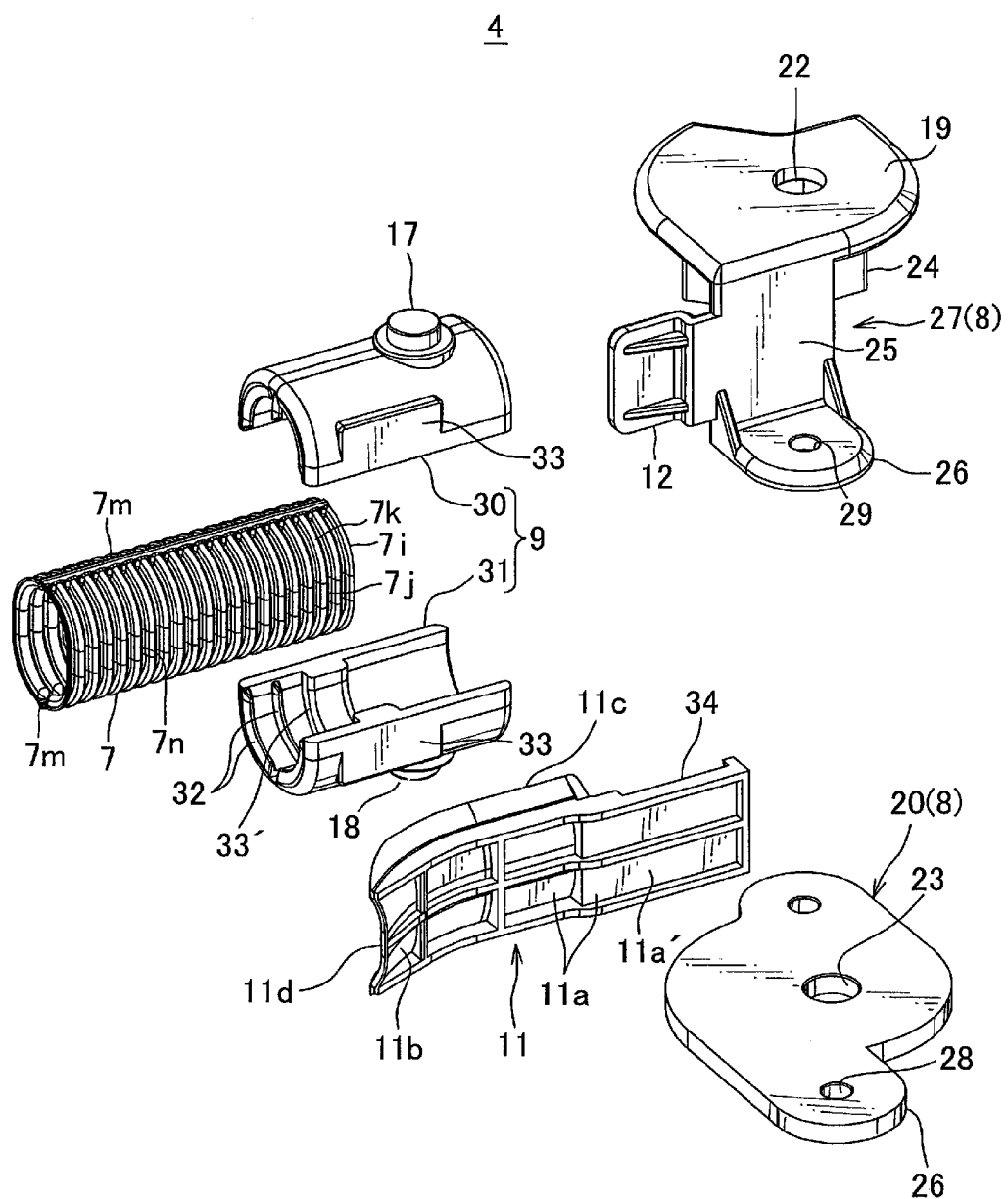
FIG. 5 is an exploded perspective view of the vehicle body-side power supply device.

FIG. 5 is an exploded view of one embodiment of the vehicle body-side power supply device 4. The outer member 8, the inner member 9 and the harness trajectory regulation wall 11 are respectively formed as separate pieces and are assembled to form the vehicle body-side power supply device 4 shown in FIG. 4A.

The outer member 8 includes the lower horizontal plate-like base wall (lower wall) 20 and a wall member 27 having a substantially inverse-concave-shaped vertical cross-section and configured to be fixed to the base wall 20. The base wall 20 and the wall member 27 are locked to each other by a locking means not shown. The locking means (i.e. a locking portion) includes, for example, a lock claw standing from the base wall 20 and a lock hole provided to the front and back wall portions 24, 25 of the wall member 27.

The base wall 20 includes a bracket portion 26 including front and back small circular holes 28 and a central, large circular hole 23 for shaft support. The wall member 27 includes the horizontal upper wall 19, the front and back vertical wall portions 24, 25, the stopper wall portion 12 projecting from the wall portion 24 at the front, and the bracket portion 26 projecting in a flange-like shape from the lower end of the front and back wall portions 24, 25. The bracket portion 26 is provided with a small circular hole 29 arranged opposite to the circular hole 28 of the base wall 20, and the upper wall 19 is provided with the large circular hole 22 for shaft support arranged opposite to the central circular hole 23 of the base wall 20.

The inner member 9 is dividable into upper and lower parts and is constituted of a pair of semi-annular-shaped (i.e. semi-cylindrical-shaped) upper and lower divided inner members 30, 31 configured to be joined together by a locking means not shown to form an annular shape (i.e. a tubular shape). Each of the divided inner members 30, 31 includes, at its outer face, an upper and lower shaft portion 17, 18, and includes, at its inner face, a rib 32 for retaining (supporting) the corrugate tube and a stopper protrusion 33' for abutting on one end face 7i of the corrugate tube 7.

The locking means (i.e. the locking portion) of the inner member 9 includes, for example, a lock claw provided to a divided face of the one divided inner member 30 and a lock hole provided to a divided face of the other divided inner member 31. The rib 32 is configured to engage to a circumferential valley portion (concave groove) 7j of the corrugate tube 7. A rectangular protruding wall 33 for positioning and retaining the harness trajectory regulation wall 11 is formed on an outer wall face of one side (i.e. the back side) of each of the divided inner members 30, 31. The harness trajectory regulation wall 11 and the protruding wall 33 are configured to be locked to each other by a locking means not shown. This locking means (i.e. a lock portion) includes, for example, a lock claw projecting from the harness trajectory regulation wall 11 and a lock hole provided to the protruding wall 33.

The corrugate tube 7 may be an existing corrugate tube having the circumferential valley portion (concave groove) 7j and mountain portion (convex protrusion) 7k arranged alternately in the longitudinal direction of the tube. The corrugate tube 7 has an oval cross-section which is long in the up-down direction. The corrugate tube 7 includes, at its upper and lower ends (i.e. in the major axis direction), a rib 7m for preventing the bending in the up-down direction which is continuous in the longitudinal direction to provide a good bendability in the minor axis direction. The plurality of electric wires not shown is passed through the corrugate tube, and the electric wire portion extending out from the end 7i of the corrugate tube 7 is passed through an inner space of the inner member 9 and extended outside, and is connected to a wiring harness not shown of the vehicle body 1 side (i.e. the power source side) of FIG. 1A by a connector and such.

The harness trajectory regulation wall 11 is formed straight along the longitudinal direction, except for the curved portion 11b at its distal end. The harness trajectory regulation wall 11 includes a concave groove portion 34 provided to a basal side of the straight portion 11a and configured to engage to the protruding wall 33 of the inner member 9. The harness trajectory regulation wall 11 includes a front facing curved wall 11c (see FIG. 6C) provided at upper and lower sides and provided at a portion from the concave groove portion 34 to the distal end of the harness trajectory regulation wall 11. The harness trajectory regulation wall 11 as well as the upper and lower curved walls 11c include a vertical curved face 11d for stably supporting, (i.e. without causing a displacement), at its inner face, an outer face 7n of the corrugate tube 7 located at one side of the minor axis side.

An outer face of a straight portion 11a' at the basal side of the harness trajectory regulation wall 11 is abutted on an inner face of one side wall (back wall) 25 of the outer member 8 as shown in FIG. 4A, and the straight portion 11a' at the basal side is positioned between the one side wall 25 of the outer member 8 and the protruding wall 33 of the inner member 9 and is locked to the inner member 9 by a locking means not shown. Also, the harness trajectory regulation wall 11 may be integrally formed with one of the upper and lower divided inner members 30, 31 by resin molding. In this case, the positioning portion (i.e. the protruding wall) 33 and the locking means with respect to the harness trajectory regulation wall 11 are no longer needed.

For example, the shaft portions 17, 18 for rotating the inner member 9 of the vehicle body side power supply device 4 may be provided to the upper wall 19 and the lower wall 20 of the outer member 8, and the hole portions 22, 23 or a concave (i.e. having bottom) bore portion for engaging these shaft portions 17, 18 may be provided to the upper and lower wall portions of the inner member 9.

Figure 6A:
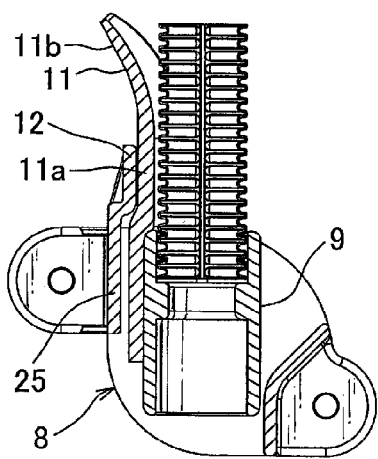
FIGS. 6A and 6B are lateral (horizontal) cross-sectional views showing the action of the vehicle body-side power supply device.
Figure 6B:
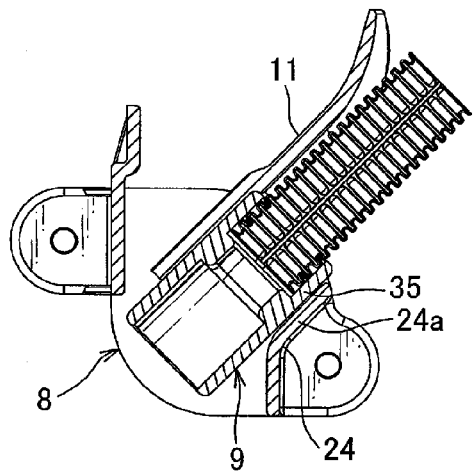
Figure 6C:
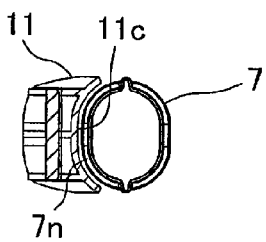
FIG. 6C is a longitudinal (vertical) cross-sectional view of a portion of the vehicle body-side power supply device.

FIGS. 6A and 6B are lateral (horizontal) cross-sectional view of the vehicle body-side power supply device 4, and FIG. 6C is a longitudinal (vertical) cross-sectional view (a vertical cross-section of the straight portion 11a of the harness trajectory regulation wall 11) of a portion of the vehicle body-side power supply device 4. FIG. 6A corresponds to FIG. 4B, and FIG. 6B corresponds to FIG. 4C.

As shown in FIG. 6A, the inner member 9 is rotated backward in a counterclockwise direction with the harness trajectory regulation wall 11, and the straight portion 11a at the basal side of the harness trajectory regulation wall 11 is abutted on the stopper wall portion 12 at the back wall 25 side of the outer member 8, thereby preventing the inner member 9 from further rotating backward. As shown in FIG. 6B, the inner member 9 is rotated forward in the clockwise direction with the harness trajectory regulation wall 11, and an outer face of a front wall portion 35 of the inner member 9 is abutted on an inner face of a slanted portion 24a which is a left-half side of the front wall portion 24 having the wide substantially V-like shape when seen from top, thereby preventing the inner member 9 from further rotating forward.

As shown in FIG. 6C, the outer face 7n of the corrugate tube 7 having the curved vertical cross-section and located at the minor axis side contacts with the inner curved face 11c of the harness trajectory regulation wall 11 having the curved longitudinal (vertical) cross-section, and the corrugate tube 7 is supported by the inner curved face 11c of the harness trajectory regulation wall 11 in a suitable manner and without a vertical displacement. Thus, the corrugate tube 7 is extended and guided straight toward the sliding door 5 (see FIGS. 1A-1B) along the harness trajectory regulation wall 11 without drooping.

Figure 7A:
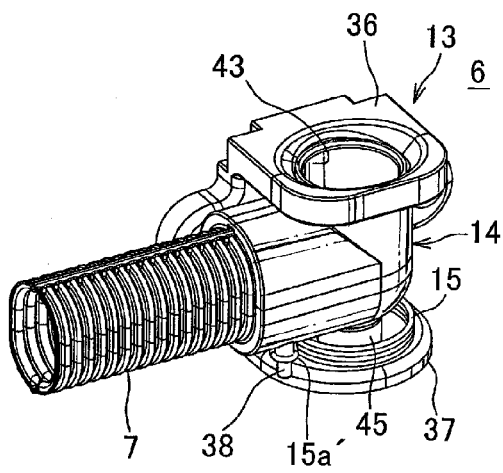
FIGS. 7A and 7B are perspective views showing one embodiment of a sliding door-side power supply device.
Figure 7B:
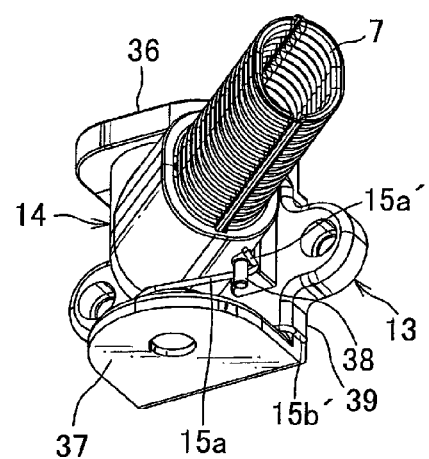
Figure 8:
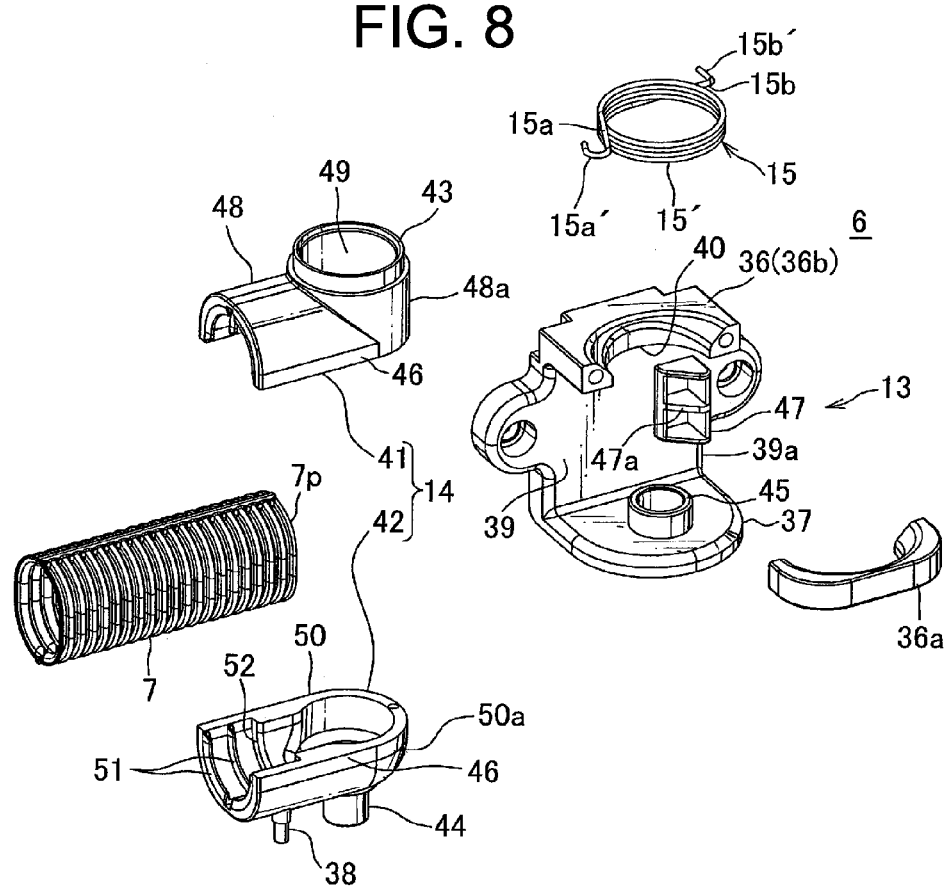
FIG. 8 is an exploded perspective view showing the sliding door-side power supply device.
Figure 9A:
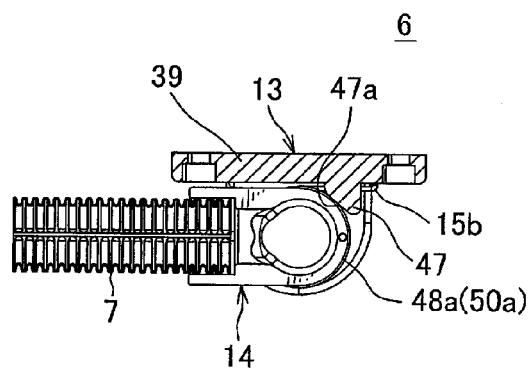
FIGS. 9A and 9B are lateral cross-sectional views showing the action of the sliding door-side power supply device.

FIGS. 7A, 7B through FIGS. 9A, 9B show one embodiment of the sliding door-side power supply device 6. FIG. 7A and FIG. 9A correspond to the fully-closed state of the sliding door of FIGS. 3A and 3B, and FIGS. 7B and 9B correspond to the fully-opened state of the sliding door of FIGS. 1A and 1B. FIG. 8 is an exploded view corresponding to FIG. 7A.

As shown in FIGS. 7A and 7B, the sliding door-side power supply device 6 includes an outer member 13 having a C-like vertical cross-section and configured to be fixed to the sliding door 5 (see FIGS. 1A-1B), an inner member 14 which is pivotally-supported so as to rotate in the horizontal direction between upper and lower horizontal wall portions 36, 37 of the outer member 13 and which is configured to retain (support) the other end portion of the corrugate tube 7 of the wiring harness, and a spring member (i.e. a second spring member) 15 configured to bias the inner member 14 so as to rotate in the vehicle back direction in the clockwise direction.

The torsion coil spring 15 as the spring member is disposed along the lower wall portion 37 of the outer member 13. A tip hook 15a' of one straight pin portion 15a (which is located at the back side in FIG. 7A) of the torsion coil spring 15 is engaged from inside to a pin portion 38 located at a lower outer face of the inner member 14, and a tip hook 15b' of the other straight pin portion (which is located at the front side) of the torsion coil spring 15 of FIG. 7B is engaged to a front end of a straight wall portion 39 connecting the upper and lower wall portions 36, 37 of the outer member 13. By doing so, the inner member 14 is biased in the backward direction by the spring member 15 such that the inner member 14 becomes from the frontward rotated position of FIG. 7B to the backward rotated position of FIG. 7A.

As shown in FIG. 8, the upper horizontal wall portion 36 of the outer member 13 is divided to right and left side from a center of a circular hole portion 40 for harness insertion, and in this state, an upper annular (tubular) shaft portion 43 of the inner member 14 is engaged to the hole portion (shaft receiving portion) 40. Then, a lower cylindrical shaft portion 44 of the inner member 14 is engaged into a tubular shaft receiving portion 45 of the lower wall portion 37 of the outer member 13, and then an upper, separated, semi-annular divided wall portion 36*a* is locked to an upper fixed wall portion 36*b* by the locking means. The locking means includes, for example, a lock hole provided at the fixed wall portion 36*b* and a lock claw provided at the divided wall portion 36*a*.

A stopper projection 47 having a substantially triangular-shaped lateral cross-section for abutting and stopping an outer face of an one side wall 46 of the inner member 14 is provided at a front end side of an inner face of the vertical wall portion 39 of the outer member 13. The stopper member 47 includes a slanted face 47*a* facing the vehicle back.

The torsion coil spring 15 is disposed in advance at an upper face of the lower wall 37 around the lower shaft receiving portion 45 of the outer member 13. The hook portion 15*a'* of the one (i.e. back) pin portion 15*a* of the torsion coil spring 15 is locked to the downward-facing pin portion 38 of a lower divided inner member 42 of the inner member 14, and the hook portion 15*b'* of the other (i.e. front) pin portion 15*b* is locked to a side end face 39*a* of the vertical wall portion 39 of the outer member 13. The torsion coil spring 15 includes a dextrorse coil portion 15', the one pin portion 15*a* extending from the upper coil portion of the coil portion 15', and the other pin portion 15*b* extending from the lower coil portion of the coil portion 15'.

The inner member 14 is constituted of the upper and lower divided inner members 41, 42. The upper divided inner member 41 includes a horizontal semi-tubular wall 48 having a proximal end side 48*a* which is closed, a circular hole portion 49 configured to penetrate upward from the proximal end side, and the annular shaft portion 43 arranged around the hole portion 49. The lower divided inner member 42 includes a horizontal semi-tubular wall 50 having a proximal end side 50*a* which is closed, a shaft portion 44 extending downward from the proximal end side, and the pin 38 for locking spring extending downward from a distal end side. Each of the semi-tubular walls 48, 50 includes, at its inner face, a circumferential rib 51 for locking corrugate tube, and a stopper step portion 52 configured to abut on the other end face 7*p* of the corrugate tube 7.

The respective semi-tubular walls 48, 50 are locked to each other by a locking means and form a tubular wall. For example, the locking means includes a lock claw projecting from the divided face of one semi-tubular wall 48 and a lock hole provided to the divided face of the other semi-tubular wall 50. In the drawing, the corrugate tube 7 is illustrated to be short; however, practically, it extends long in the distal end direction of the tubular wall 48, 50.

It is noted that, for example, it is possible to eliminate the lower shaft portion 44 of the inner member 14 of the sliding door-side power supply device 6 and provide, to the lower wall portion of the inner member 14, a hole portion or a concave (i.e. having bottom) bore portion not shown configured to engage to the tubular or cylindrical shaft portion 45 of the outer member 13. Alternatively, it is possible to eliminate the upper annular shaft portion 43 of the inner member 14 and provide a projection not shown having an arch-like shape and such when seen from top which projects from the upper wall portion 48 of the inner member 14, and provide, to the upper wall portion 36, a groove portion not shown having an arch-like shape (substantially semi-circular shape) when seen from top and configured to slidably engage to that projection, so as to be concentric with the lower shaft portion 45 of the outer member 13.

As shown in FIG. 9A, when the sliding door 5 is fully closed as shown in FIG. 3A, the inner member 14 of the sliding door-side power supply device 6 faces the vehicle back side with the corrugate tube 7 of the wiring harness, while the backward-facing slanted face 47*a* of the stopper projection 47 of the outer member 13 is positioned close to and along the front end portion (proximal end portion) 48*a* (50*a*) of the inner member 14.

Figure 9B:
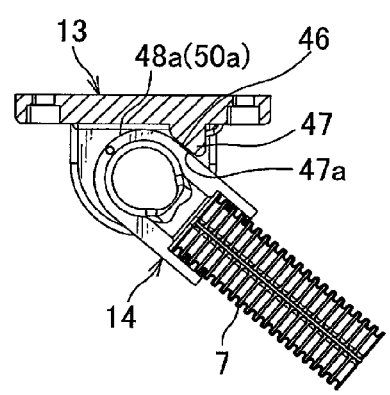

As shown in FIG. 9B, when the sliding door 5 is fully opened as shown in FIG. 1A, the front outer face 46 at the proximal end portion 48*a* (50*a*) side of the inner member 14 of the sliding door-side power supply device 6 abuts on the backward-facing slanted face 47*a* of the stopper projection 47 of the outer member 13. Thus, further counterclockwise rotation of the inner member 14 is prevented, and the inner member 14 and the corrugate tube 7 of the wiring harness are positioned so as to face the inside of the vehicle and so as to be slanted in a diagonally-frontward direction.

As a result, when the sliding door 5 is slid forward from the fully-opened state of the sliding door 5 of FIGS. 1A-1B, the inner member 14 of the sliding door-side power supply device 6 and the corrugate tube 7 of the wiring harness are smoothly rotated in the backward and clockwise direction as indicated by the arrow A in FIG. 1B with a small operation force, without causing a buckling or bending of the corrugate tube 7. Thus, due to the combination with the effect of the spring member 15 which biases the corrugate tube 7 in the A direction, the bending action of the corrugate tube 7 which takes place when transferring to the half-opened state to the sliding door 5 of FIGS. 2A-2B can be performed smoothly without being stuck.

FIGS. 10 through 12A, 12B illustrate another embodiment of the vehicle body-side power supply device. This vehicle body-side power supply device 55 includes a torsion coil spring (i.e. a spring member or a first spring member) 56, and is configured to bias the inner member 9 to the vehicle front side (i.e. the D direction in FIG. 10) with the corrugate tube 7 of the wiring harness by the biasing force of the spring member 56. The same reference signs are used for the similar elements as the embodiment of FIGS. 4A to 5 to eliminate explanation.

Figure 10:
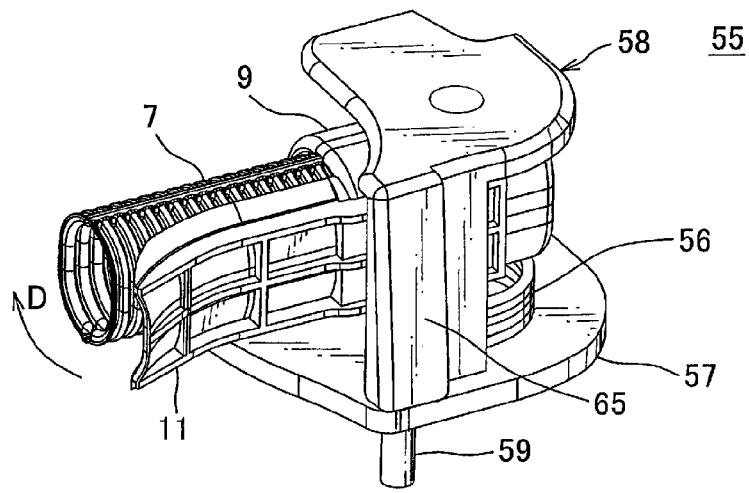
FIG. 10 is a perspective view showing a vehicle body-side power supply device according to another embodiment.

As shown in FIG. 10, this vehicle body-side power supply device 55 includes an outer member 58 made of synthetic resin and configured to be positioned to the vehicle body 1 side by a downward-facing pin 59 of a base wall (i.e. a lower horizontal wall portion) and fixed by bolting and such, an inner member 9 made of synthetic resin which is pivotally-supported to the outer member 58 so as to rotate in the horizontal direction and which is configured to retain (support) one end portion of the corrugate tube 7 of the wiring harness, a harness trajectory regulation wall 11 made of synthetic resin and integrally-formed with or fixed to the inner member 9, and a torsion coil spring (i.e. spring member) 56 made of metal and configured to bias the inner member 9 to the vehicle front direction in the clockwise direction (i.e. the D direction in FIG. 10). The torsion coil spring 56 is disposed between the base wall 57 of the outer member 58 and the inner member 9.

Figure 11:
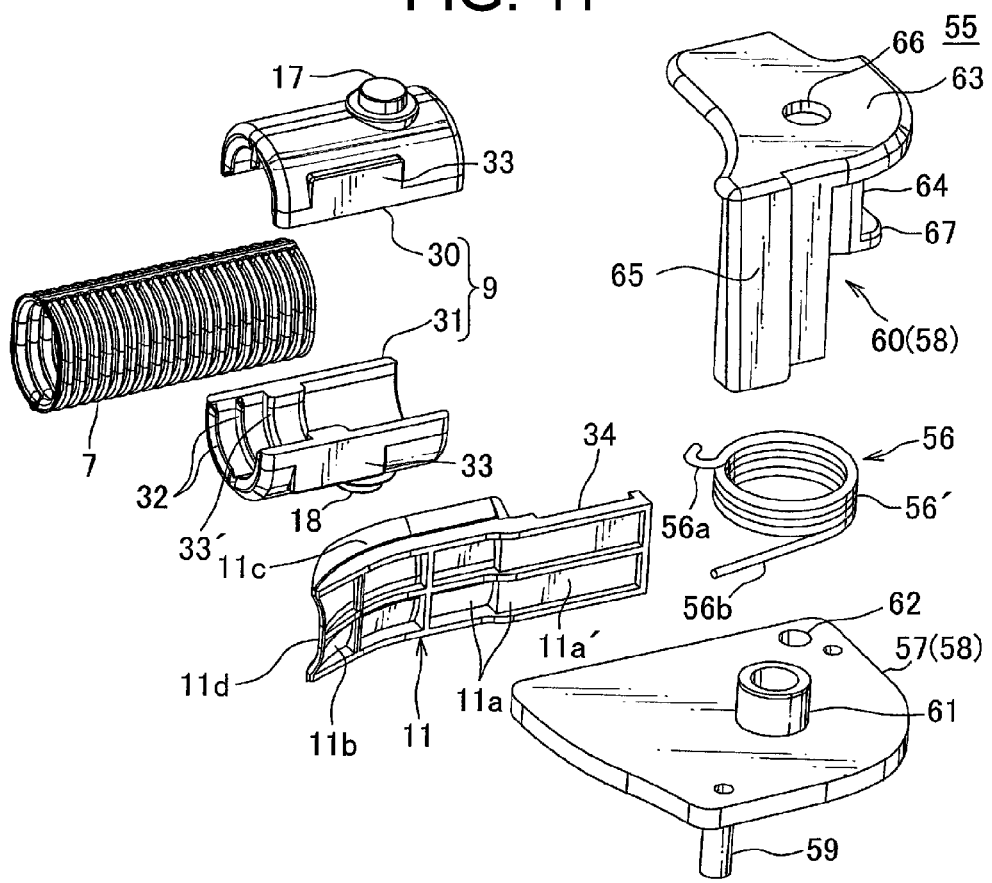
FIG. 11 is an exploded perspective view showing the vehicle body-side power supply device according to the another embodiment.

As shown in FIG. 11, the outer member 58 is constituted of the horizontal based wall 57 and a wall member 60 having an inverse-concave-shaped vertical cross-section and configured to be fixed to the base wall 57 by a locking means and such. The base wall 57 includes a positioning pin 59 for the vehicle body side provided at a back end side of a lower face of the base wall 57, a tubular shaft receiving portion 61 provided at a substantially center of an upper face of the base wall 57, and a bolt insertion hole 62 for fixation provided to a front end side of the base wall 57. The wall member 60 includes an upper horizontal wall portion 63 and front and back vertical wall portions 64, 65, a shaft receiving hole 66 provided at the upper wall portion 63, and a bracket 67 provided at a lower end of the front wall portion 64 and having a hole portion communicating to the bolt insertion hole 62 of the base wall 57. The base wall 57 and the wall member 60 are locked to each other by a locking means (e.g. a lock hole and a lock claw) not shown.

Like the embodiment of FIG. 5, the inner member 9 is constituted of upper and lower divided inner members 30, 31. Each of the inner members 30, 31 includes upper and lower shaft portions 17, 18 provide to an outer face of the inner member 30, 31, and a rib 32 for retaining (supporting) corrugate tube and a stopper step portion 33' for abutment provided to an inner face of the inner member 30, 31. Like the embodiment of FIG. 5, a harness trajectory regulation wall 11 is constituted of a straight portion 11a and a curved portion 11b located at a distal end of the harness trajectory regulation wall 11. The harness trajectory regulation wall 11 includes a concave groove portion 34 provided to a proximal end side of the straight portion 11a and configured to engage to a protruding wall 33 located at one side face of the inner member 9, upper and lower curved wall portions 11c located further toward a distal end than the concave groove portion 34, and an inner face 11d having a curved longitudinal (i.e. vertical) cross-section.

The torsion coil spring 56 includes a dextrorse coil portion 56', one (i.e. front) pin portion 56a extending from an upper coil portion of the coil portion 56' and bending in a hook-like shape, and the other (i.e. back) pin portion 56b extending from a lower coil portion of the coil portion 56'. The torsion coil spring 56a is disposed around the shaft receiving portion 61 of the base wall 57, and the one pin portion 56a is locked to the inner member 9, while the other pin portion 56b is locked to the outer member 58.

Figure 12A:
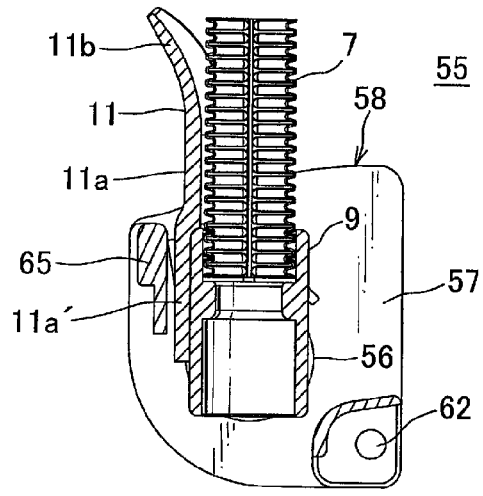
FIGS. 12A and 12B are lateral cross-sectional views showing the action of the vehicle body-side power supply device according to the another embodiment.
Figure 12B:
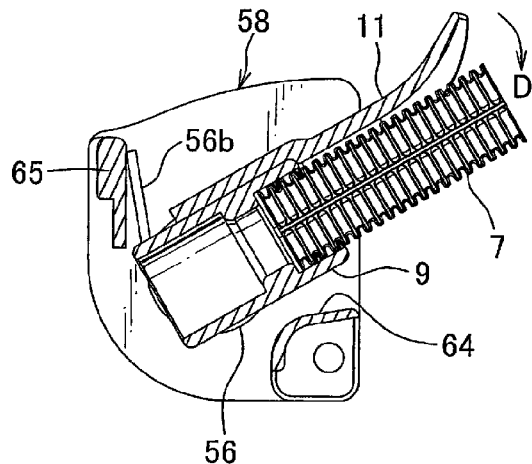

Referring to FIGS. 12A and 12B, the back pin portion 56b of the torsion coil spring 56 elastically abuts on an inner face of the back wall 65 of the outer member 58, while the front pin portion 56a is locked to a pin portion not shown projecting e.g. from a lower end face of the inner member 9. FIG. 12A corresponds to the fully-opened or half-opened state of the sliding door 5 of FIGS. 1A-1B and 2A-2B, and illustrates the state in which the inner member 9 is pulled by the corrugate tube 7 of the wiring harness and rotated backward with the corrugate tube 7 against the biasing force of the torsion coil spring 56, and the outer wall face 11a' at the proximal end side of the harness trajectory regulation wall 11 is abutted on and stopped by the inner face of the back wall 65 of the outer member 58.

FIG. 12B corresponds to the fully-closed state of the sliding door 5 of FIGS. 3A-3B, and illustrates the state in which the inner member 9 is rotated forward in the clockwise direction with the harness trajectory regulation wall 11 and the corrugate tube 7 of the wiring harness by the biasing force of the torsion coil spring 56. In this example, for example, the biasing force of the torsion coil spring 56 is almost disappeared at the rotated position of the inner member 9 of FIG. 12B, thus further rotation of the inner member 9 in the D direction is inhibited by the reaction force of the torsion coil spring 56, eliminating the need of the stopper portion (refer to the reference sign 24 in FIG. 4C) of the outer member 58 with respect to the inner member 9. For the excessive rotation of the inner member 9 in the D direction, the front wall portion 64 of the outer member 58 functions as the stopper portion.

As shown in FIG. 12B, the harness trajectory regulation wall 11 is rotated forward with the inner member 9 by the torsion coil spring 56, and the position of the distal end of the harness trajectory regulation wall 11 of FIG. 12B is retracted further inside of the vehicle compared to the position of the distal end of the harness trajectory regulation wall 11 of FIG. 12A. As a result, in the fully-closed state of the sliding door 5 of FIG. 3B, the space $S_2$ (see FIGS. 3A-3B) between the distal end of the harness trajectory regulation wall 11 and the inner panel 5a of the sliding door 5 is securely formed, thereby reliably preventing the interference between the harness trajectory regulation wall 11 and the sliding door 5 as well as the damage and such resulting from said interference.

It is noted that, for example, the upper shaft portion 17 for rotating the inner member 9 of the vehicle body-side power supply device 55 of FIG. 11 may be provided to the upper wall 63 of the outer member 58, and the lower shaft portion 18 may be formed in a step-like shape and integrally with the large-diameter shaft portion 61 of the lower wall 57 of the outer member, while the hole portion 66 (see reference signs 22, 23 of FIG. 5) or the concave (i.e. having bottom) bore portion configured to engage to the shaft portions 17, 18 may be provided to the upper and lower wall portions of the inner member 9.

The spring force of the torsion coil spring (i.e. the spring member) 56 of the vehicle body-side power supply device 55 shown in FIGS. 10-12B is set to be equal to or stronger than the spring force of the torsion coil spring (i.e. the spring member) 15 of the sliding door-side power supply device 6 shown in FIGS. 7A-8. Preferably, the spring force of the torsion coil spring 56 is set to be stronger than the spring force of the torsion coil spring 15 (that is, the spring force of the torsion coil spring 15 is set to be weaker than the spring force of the torsion coil spring 56).

Figure 13:
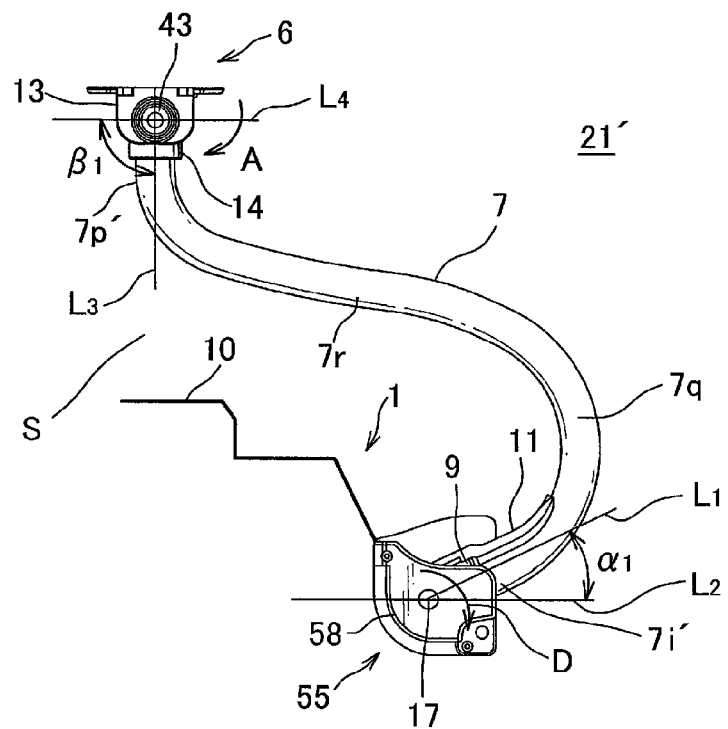
FIG. 13 is a top view showing the action of the vehicle body-side power supply device according to the another embodiment.

FIG. 13 illustrates the action of a power supply apparatus for sliding structure 21' characterized in that the spring force of the torsion coil spring 56 (see FIG. 10) of the vehicle body-side power supply device 55 is set to be stronger than the spring force of the torsion coil spring 15 (see FIGS. 7A-7B) of the sliding door-side power supply device 6.

When the sliding door 5 is half-opened, the torsion coil spring 15 of the sliding door-side power supply device 6 biases the inner member 14 of the power supply device 6 to rotate with one end portion (or the other end portion) 7p' of the corrugate tube 7 of the wiring harness in the A direction (i.e. the clockwise direction or the backward direction). However, the torsion coil spring 56 of the vehicle body-side power supply device 55 biases the inner member 9 of the power supply device 55 to rotate with the other end portion (or one end portion) 7i' of the corrugate tube 7 of the wiring harness in the D direction (i.e. the clockwise direction or the frontward direction) by the spring force which is stronger than that of the torsion coil spring 15 of the sliding door-side power supply device 6. As a result, an angle $\alpha_1$ formed between an imaginary straight line $L_1$ extending from a center of the shaft portion 17 of the inner member 9 of the vehicle body-side power supply device 55 in the longitudinal direction of the other end portion (or the one end portion) 7i' of the corrugate tube 7 and an imaginary straight line $L_2$ extending in the vehicle front-back direction becomes smaller than an angle $\beta_1$ formed between an imaginary straight line $L_3$ extending from a center of the shaft portion 43 of the inner member 14 of the sliding door-side power supply device 6 in the longitudinal direction of the one end portion (or the other end portion) 7p' of the corrugate tube 7 and an imaginary straight line $L_4$ extending in the vehicle front-back direction.

In other words, as the sliding door 5 is slid forward from the fully-opened state of the sliding door 5 of FIGS. 1A-1B to the half-opened state, the inner member 14 of the sliding door-side power supply device 6 in the state of FIGS. 1A-1B is rotated in the A direction (i.e. the direction of closing of the sliding door 5) for a small angle, as shown in FIG. 13, because the spring force of the torsion coil spring 15 of the sliding door-side power supply device 6 is weak, and at the same time, the inner member 9 of the vehicle body-side power supply device 55 in the state of FIGS. 1A-1B is rotated in the D direction (i.e. the direction of closing of the sliding door 5) for a large angle, as shown in FIG. 13, because the spring force of the torsion coil spring 56 of the vehicle body-side power supply device 55 is strong.

Therefore, the corrugate tube 7 of the wiring harness between the sliding door-side power supply device 6 and the vehicle body-side power supply device 55 is bent forward from the vehicle body-side power supply device 55 in a substantially U-like shape with a large radius, as shown in FIG. 13, and a corrugate tube portion continuing from that bent portion 7q is slanted toward and extends straight to the sliding door side, and that slanted corrugate tube portion 7r continues to the inner member 14 of the sliding door-side power supply device 6 with a radius that is slightly smaller than the bent portion 7q, thus the slanted corrugate tube portion 7r is moved toward the sliding door side so as to be far away from the vehicle body portion 10 of the vehicle body 1 which is likely to interfere, thereby forming the large space S between the corrugate tube 7 and the vehicle body portion 10. As a result, the interference between the corrugate tube 7 of the wiring harness and the vehicle body 1 can be prevented in a reliable manner.

The same effect as the above-mentioned effect can be obtained when the sliding door 5 is slid backward from the fully-closed state of the sliding door 5 of FIGS. 3A-3B to the half-opened state. That is, when the sliding door 5 is opened (i.e. half-opened) from the fully-closed state of the sliding door 5 of FIGS. 3A-3B, the inner member 9 of the vehicle body-side power supply device 55 is rotated in the counterclockwise direction (i.e. the reverse direction of the D direction) for the small angle $\alpha_1$ against the large biasing force of the torsion coil spring 56, as shown in FIG. 13, or is not rotated at all and maintains the rotation angle of the inner member 9 in the fully-closed state of the sliding door 5 of FIGS. 3A-3B, because the spring force of the torsion coil spring 56 (see FIG. 10) of the vehicle body-side power supply device 55 is strong. At the same time, the inner member 14 of the sliding door-side power supply device 6 in the state of FIGS. 3A-3B is rotated in the counterclockwise direction (i.e. the reverse direction of the A direction) for the large angle $\beta_1$ against the small biasing force of the torsion coil spring 15, as shown in FIG. 13, because the spring force in the A direction of the torsion coil spring 15 (see FIGS. 7A-7B) of the sliding door-side power supply device 6 is weak. As a result, the same effect as explained above can be obtained.

Although the spring force of the torsion coil spring 56 of the vehicle body-side power supply device 55 is stronger than the spring force of the torsion coil spring 15 of the sliding door-side power supply device 6, the corrugate tube 7 of the wiring harness is still pulled backward by the force which is stronger than the spring force of the torsion coil spring 56 of the vehicle body-side power supply device 55 in the fully-opened state of the sliding door 5 of FIGS. 1A-1B. Thus, as shown in FIGS. 1A-1B, the harness trajectory regulation wall 11 of the vehicle body-side power supply device 55 projects outward, thereby preventing the interference between the corrugate tube 7 and the vehicle body portion 10.

Even if the harness trajectory regulation wall 11 of the vehicle body-side power supply device 55 is eliminated, the action of the torsion coil spring 56 of the vehicle body-side power supply device 55 makes the corrugate tube 7 of the wiring harness to be in the bent state which is similar to the trajectory of the corrugate tube 7 shown in FIGS. 1A-2B. Thus, the interference between the corrugate tube 7 and the vehicle body portion 10 can be prevented.

Almost the same effect as the one mentioned above can be obtained when the spring force of the torsion coil spring 15 of the sliding door-side power supply device 6 is equal to the spring force of the torsion coil spring 56 of the vehicle body-side power supply device 55. That is, in FIG. 13, the inner member 14 of the sliding door-side power supply device 6 with the other end portion 7p' of the corrugate tube 7 is rotated for a small amount in the A direction (i.e. in the clockwise direction), and the angle $\beta_1$ becomes slightly smaller than that of FIG. 13, while the inner member 9 of the vehicle body-side power supply device 55 is rotated for a small amount in the counterclockwise direction (i.e. the reverse direction of the D direction), and the angle $\alpha_1$ becomes slightly greater than that of FIG. 13.

The inclination of the longitudinal middle portion 7r of the corrugate tube 7 becomes shallower than that of FIG. 13. However, there still exists sufficient space S between the corrugate tube 7 and the vehicle body portion 10, preventing the interference between the corrugate tube 7 and the vehicle body 1. For example, when the sliding door 5 in the state shown FIG. 13 is slid for a little in the backward direction (i.e. in the opening direction), the configuration of the corrugate tube 7 and the respective power supply devices 6, 55 becomes the same as that of the half-opened state of the sliding door 5 of FIGS. 2A-2B. In this case also, it is possible to eliminate the harness trajectory regulation wall 11 of the vehicle body-side power supply device 55.

Figure 14:
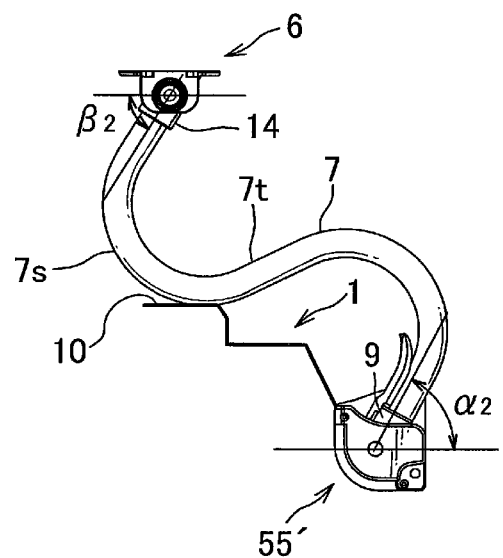
FIG. 14 is a top view showing an extreme comparative example for explaining the action of the another embodiment of FIG. 13.

For example, contrary to the embodiment of FIG. 13, if the spring force of the torsion coil spring 15 of the sliding door-side power supply device 6 is set to be stronger than the spring force of the torsion coil spring 56 of the vehicle body-side power supply device 55', then, as shown in FIG. 14, in the half-opened state of the sliding door 5, a rotation angle $\alpha_2$ of the inner member 9 of the vehicle body-side power supply device 55' becomes greater than the angle $\alpha_1$ of FIG. 13, while a rotation angle $\beta_2$ of the inner member 14 of the sliding door-side power supply device 6 becomes smaller than the angle $\beta_1$ of FIG. 13. Thus, the corrugate tube portion 7s of the wiring harness adjacent to the sliding door is bent in substantially U-like shape and in the inward and diagonally backward direction, and a longitudinal middle portion 7t of the corrugate tube 7 is slanted toward the vehicle body 1 side, possibly causing the interference with the vehicle body portion 10, as shown in FIG. 14.

The corrugate tube 7 of the wiring harness of FIG. 13 is biased forward (i.e. in the closing direction of the sliding door 5) by the spring force of the spring member 56 of the vehicle body-side power supply device 55 and is bent forward in the substantially U-like shape, thereby absorbing the slack of the corrugate tube 7 between the sliding door-side power supply device 6. In contrast, the corrugate tube 7 of the wiring harness of FIG. 14 is bent in the substantially S-like shape between the vehicle body-side power supply device 55' and the sliding door-side power supply device 6 and slacks off, thus the corrugate tube 7 is more likely to interfere with the vehicle body portion 10. Therefore, as in the case of FIG. 13, it is necessary to set the spring force of the torsion coil spring 56 of the vehicle body-side power supply device 55 to be equal to or stronger than the spring force of the torsion coil spring 15 of the sliding door-side power supply device 6.

The spring force of the torsion col spring 15, 56 can be changed easily by increasing or decreasing the wire diameter (i.e. thickness) of the coil portion 15', 56'. The spring force is increased by increasing the wire diameter of the coil portion 15', 56', and the spring force is decreased by decreasing the wire diameter of the coil portion 15', 56'. For the spring member, a helical coil spring or an arch-like flat spring or the like not shown may be used in place of the torsion coil spring 15, 56.

The respective embodiments described above are explained with the example of using the corrugate tube 7 as the exterior member of the wiring harness; however, an existing caterpillar-like exterior member (not shown) may be used in place of the corrugate tube 7. The caterpillar-like exterior member may include a plurality of (many) substantially rectangular-tube shaped hollow pieces bendably connected to each other by a shaft and a hole, wherein each of the pieces includes, the upper and lower shafts at its distal end side and the upper and lower holes at its proximal end side. The wiring harness is formed by inserting the plurality of electrical wires into the respective pieces. The upper and lower shafts of the piece located at one end of the caterpillar-like exterior member are engaged to the upper and lower bores located on the inner face of the horizontal tubular wall (i.e. the harness lead-out portion) of the inner member 9, 14 of the vehicle body-side or the sliding door-side power supply device 4, 6, 55, while the upper and lower holes of the piece located at the one end of the caterpillar-like exterior member are engaged to the upper and lower shafts located on the inner face of the horizontal tubular wall (i.e. the harness lead-out portion) of the inner member 9, 14 of the sliding door-side or the vehicle body-side power supply device 4, 6, 55, thereby connecting the respective ends of the caterpillar-like exterior member to the respective power supply devices 4, 6, 55.

The power supply apparatus for sliding structure according to the present invention is a power supply apparatus for sliding structure for constantly supplying power from a fixed structure to a sliding structure, which can reduce the size, weight and cost of a power supplying structure at the sliding structure side and/or at the fixed structure, which can reliably prevent, with a simple structure, the interference between a wiring harness and the fixed structure when the sliding structure is fully-opened, which can prevent the decrease in the bending durability of the wiring harness due to the prevention of said interference, and which can achieve smooth bending of the wiring harness during the opening operation and/or the closing operation of the sliding structure and improve the bending durability of the wiring harness.

REFERENCE SIGNS LIST

1 vehicle body (fixed structure)
4, 55 vehicle body (fixed structure)-side power supply device
5 sliding door (sliding structure)
6 sliding door (sliding structure)-side power supply device
7 corrugate tube (exterior member)
8, 58 outer member
9 inner member
11 harness trajectory regulation wall
13 outer member
14 inner member
15 torsion coil spring (second spring member)
21, 21' power supply apparatus for sliding structure
47 stopper projection
56 torsion coil spring (first spring member)

The invention claimed is:

1. A power supply apparatus for sliding structure comprising:
a fixed structure-side power supply device; and
a wiring harness having an exterior member and wired from the fixed structure-side power supply device to a sliding structure side,
wherein the fixed structure-side power supply device includes:
an outer member fixed to the fixed structure;
an inner member supported to the outer member so as to rotate in a horizontal direction and configured to support one end portion of the exterior member; and
a harness trajectory regulation wall configured to rotate integrally with the inner member,
wherein, when the sliding structure is fully-opened, the harness trajectory regulation wall projects outward from the outer member in a thickness direction of the sliding structure, such that the exterior member arranged along the harness trajectory regulation wall is moved away from the fixed structure toward the sliding structure side, thereby preventing interference between the exterior member and the fixed structure.

2. The power supply apparatus for sliding structure according to claim 1, wherein, when the sliding structure is fully-closed, the harness trajectory regulation wall is rotated and escaped with the inner member in a closing direction of the sliding structure, thereby preventing the interference between the harness trajectory regulation wall and the sliding structure.

3. The power supply apparatus for sliding structure according to claim 2, wherein the fixed structure-side power supply device includes a spring member configured to bias the inner member so as to rotate the harness trajectory regulation wall in the closing direction of the sliding structure.

4. The power supply apparatus for sliding structure according to claim 3, wherein a sliding structure-side power supply device provided to the sliding structure includes:
an outer member fixed to the sliding structure;
an inner member supported to the outer member so as to rotate in a horizontal direction and configured to support another end portion of the exterior member; and
a spring member configured to bias the inner member so that the inner member is rotated inward from the sliding structure when the sliding structure is fully-opened.

5. The power supply apparatus for sliding structure according to claim 4, wherein the outer member of the sliding structure-side power supply device includes a stopper projection configured to make the inner member of the sliding structure-side power supply device to abut on the stopper projection at an inwardly-rotated position with respect to the sliding structure.

6. The power supply apparatus for sliding structure, wherein spring force of the spring member of the fixed structure-side power supply device is set to be equal to or stronger than spring force of the spring member of the sliding structure-side power supply device according to claim 4.

7. The power supply apparatus for sliding structure according to claim 6, wherein the outer member of the sliding structure-side power supply device includes a stopper projection configured to make the inner member of the sliding structure-side power supply device to abut on the stopper projection at an inwardly-rotated position with respect to the sliding structure.

8. The power supply apparatus for sliding structure according to claim 2, wherein a sliding structure-side power supply device provided to the sliding structure includes:
an outer member fixed to the sliding structure;
an inner member supported to the outer member so as to rotate in a horizontal direction and configured to support another end portion of the exterior member; and
a spring member configured to bias the inner member so that the inner member is rotated inward from the sliding structure when the sliding structure is fully-opened.

9. The power supply apparatus for sliding structure according to claim 8, wherein the outer member of the sliding structure-side power supply device includes a stopper projection configured to make the inner member of the sliding structure-side power supply device to abut on the stopper projection at an inwardly-rotated position with respect to the sliding structure.

10. The power supply apparatus for sliding structure, wherein spring force of the spring member of the fixed structure-side power supply device is set to be equal to or stronger than spring force of the spring member of the sliding structure-side power supply device according to claim 8.

11. The power supply apparatus for sliding structure according to claim 10, wherein the outer member of the sliding structure-side power supply device includes a stopper projection configured to make the inner member of the sliding structure-side power supply device to abut on the stopper projection at an inwardly-rotated position with respect to the sliding structure.

12. The power supply apparatus for sliding structure according claim 1, wherein a sliding structure-side power supply device provided to the sliding structure includes:
　　an outer member fixed to the sliding structure;
　　an inner member supported to the outer member so as to rotate in a horizontal direction and configured to support another end portion of the exterior member; and
　　a spring member configured to bias the inner member so that the inner member is rotated inward from the sliding structure when the sliding structure is fully-opened.

13. The power supply apparatus for sliding structure, wherein spring force of the spring member of the fixed structure-side power supply device is set to be equal to or stronger than spring force of the spring member of the sliding structure-side power supply device according to claim 12.

14. The power supply apparatus for sliding structure according to claim 13, wherein the outer member of the sliding structure-side power supply device includes a stopper projection configured to make the inner member of the sliding structure-side power supply device to abut on the stopper projection at an inwardly-rotated position with respect to the sliding structure.

15. The power supply apparatus for sliding structure according to claim 12, wherein the outer member of the sliding structure-side power supply device includes a stopper projection configured to make the inner member of the sliding structure-side power supply device to abut on the stopper projection at an inwardly-rotated position with respect to the sliding structure.

16. A power supply apparatus for sliding structure comprising:
　　a fixed structure-side power supply device;
　　a sliding structure-side power supply device; and
　　a wiring harness having an exterior member and wired from the fixed structure-side power supply device to the sliding structure-side power supply device,
　　wherein the fixed structure-side power supply device includes:
　　　　an outer member fixed to the fixed structure;
　　　　an inner member supported to the outer member so as to rotate in a horizontal direction and configured to support one end portion of the exterior member; and
　　　　a first spring member configured to bias the inner member so as to rotate in a closing direction of the sliding structure,
　　wherein the sliding structure-side power supply device includes:
　　　　an outer member fixed to the sliding structure;
　　　　an inner member supported to the outer member so as to rotate in the horizontal direction and configured to support another end portion of the exterior member; and
　　　　a second spring member configured to bias the inner member so as to rotate in an opening direction of the sliding structure, and
　　wherein spring force of the first spring member is set to be equal to or stronger than spring force of the second spring member.

\* \* \* \* \*